(12) United States Patent
Burgyan

(10) Patent No.: US 8,044,673 B1
(45) Date of Patent: Oct. 25, 2011

(54) METHOD AND APPARATUS FOR POSITIONING AND CONTACTING SINGULATED SEMICONDUCTOR DIES

(76) Inventor: Lajos Burgyan, Mountain View, CA (US)

( * ) Notice: Subject to any disclaimer, the term of this patent is extended or adjusted under 35 U.S.C. 154(b) by 0 days.

(21) Appl. No.: 13/092,398

(22) Filed: Apr. 22, 2011

Related U.S. Application Data

(60) Provisional application No. 61/329,087, filed on Apr. 28, 2010.

(51) Int. Cl.
   *G01R 31/00* (2006.01)
   *G01R 31/20* (2006.01)
   *G01R 31/02* (2006.01)

(52) U.S. Cl. .......... 324/750.16; 324/750.25; 324/762.01

(58) Field of Classification Search .................. None
   See application file for complete search history.

(56) References Cited

U.S. PATENT DOCUMENTS

| | | | |
|---|---|---|---|
| 5,360,348 A | 11/1994 | Johnson | |
| 5,410,258 A | 4/1995 | Bowers | |
| 5,557,212 A | 9/1996 | Isaac | |
| 6,204,680 B1 * | 3/2001 | Swart et al. | 324/754.08 |
| 6,400,169 B1 * | 6/2002 | Hembree | 324/750.25 |
| 6,424,166 B1 | 7/2002 | Henry | |
| 6,798,228 B2 | 9/2004 | Cuevas | |
| 6,802,728 B1 | 10/2004 | Howell | |
| 6,819,127 B1 | 11/2004 | Hembree | |
| 7,579,826 B2 | 8/2009 | Lee | |
| 2001/0000947 A1 * | 5/2001 | Swart et al. | 324/755 |
| 2008/0186046 A1 * | 8/2008 | Yun et al. | 324/765 |

* cited by examiner

*Primary Examiner* — Jermele M Hollington
(74) *Attorney, Agent, or Firm* — David E. Newhouse, Esq.

(57) ABSTRACT

A re-configurable test socket system and test socket architecture are described involving a combination of particular micro elements and re-useable macro elements that can be reused and reconfigured for testing a wide variety of different semiconductor and integrated circuit (IC) DUT packages having different shapes, sizes, and terminal configurations.

23 Claims, 7 Drawing Sheets

METHOD AND APPARATUS FOR POSITIONING AND CONTACTING SINGULATED SEMICONDUCTOR DIES

RELATED APPLICATIONS

This Application claims all benefits applicable under 35 U.S.C. §119(e) related to U.S. Provisional Patent Application Ser. No. 61/329,087 filed by the Applicant on 28 Apr. 2010 entitled "METHOD AND APPARATUS FOR POSITIONING AND CONTACTING SINGULATED BUMPED SEMICONDUCTOR DIES AND QFN DEVICES", and incorporates U.S. Provisional Patent Application Ser. No. 61/120,822, in its entirety, by reference into this application.

FIELD OF THE INVENTION

The present invention relates generally to test sockets for evaluating performance of an integrated circuit (ICs) or semiconductor device. More particularly, the present invention relates to a test sockets system and manufacture of particular test socket architecture developed for testing micron dimensioned integrated circuits (IC/semiconductor chip packages) having solder pad, solder ball, copper pillar or similar type terminals.

BACKGROUND OF THE INVENTION

Test socket systems are essential and widely used in design, development and manufacture of integrated circuit and semiconductor packages in the electronic arts. Such systems are typically limited by the particular architecture of the actual test socket that connects between terminals of such integrated circuit packages and the test equipment in final testing stages of design, development, prototyping and manufacturing of integrated circuit packages being tested or examined and are commonly referred to by an acronym DUT, meaning 'Device Under Test'. Ideally, test sockets establish an electrical connection between terminals of a DUT and test equipment in a manner that both mechanically protects the IC terminals and minimizes interference with the electronic functionality of the IC package being tested.

Performance parameters required of test sockets directly relate to the operating frequencies, and electrical current capacity of high-performance DUT. Inductive, capacitive and resistive properties of test sockets must be minimized to preclude corruption or skewing of measured parameters generated by the DUT.

Z-axis anisotropic conductive, elastomer sheets shown in cross-section in FIGS. 1a, 1b, & 1c are a key element in existing test socket systems. Such anisotropically conductive elastomer sheets are commercially available from several manufacturers, and they are incorporated into the present invention as a component, without alterations. In particular, as shown in FIG. 1a, the electrically insulative sheet of a silicone elastomer 100 has a matrix of high density of electrically conductive columns 101 of embedded balls. The individual balls within each vertical column are in physical contact, for assuring electrical conduction perpendicularly relative to the sheet (Z-axis). Lateral electrical conduction in the X-Y plane of the sheet is precluded the insulating silicone material separates each individual column 101. As shown, the conductive ball columns 101 make electrical contact only with conductive traces 102, on a top surface of printed circuit board (PCB) 103 that are the located directly below them, leaving all other conductive ball columns unconnected. Similarly, the ball columns will only make electrical contact with electrical contacts located directly above the ball column. (See U.S. Pat. No. 6,702,587, R. E. Weiss, et al)

In FIG. 1b the Z-axis conductive sheet 100 is located between the printed circuit board 103 and a copper pillar terminal 104 of a semiconductor package DUT 105. A downward force, F, impressed on the DUT 105 compresses the elastomer sheet 100, buckling in the conductive ball columns 101 located directly beneath copper pillar 104. Both balls of buckled columns 101 and the balls at the ends of the ball columns 101 respectively remain in electrical contact with each other within the buckled column 101 and at the ends with the copper pillar 104 and the conductive traces 102 of the printed circuit board PCB 103 maintaining electrical connection between the PCB 103 and the copper pillar terminal 104. As in the uncompressed case, the insulating silicone material 100 separates each individual ball column 101 for precluding electrical conduction in the X-Y plane.

FIG. 1c shows a cross-section diagram of another type of Z-axis conductive elastomer sheet where the silicone insulating elastomer sheet 100 has a matrix of embedded electrically conductive, tilted parallel wire studs 107 available from Shin-Etsu Polymer Co., Ltd. (See http://www.shinpoly.co.jp/business/connector/) The top and bottom ends of each individual wire stud slightly extend beyond the top and bottom surface of silicone sheet 100 for assuring Z-axis electrical conduction through the sheet. Similarly, electrical conduction in the X-Y plane of the sheet 100 is precluded by the insulative silicone material embedding the wire studs 107. Conductive traces 102, located at the top surface of printed circuit board PCB 103 and solder ball 108 of semiconductor IC package (DUT) 105, are slightly offset horizontally relative each other to accommodate tilt of wire studs 102 as the elastomer sheet is compressed for preserving and minimizing resistance to electrical conduction between the traces 102 and the solder balls 108.

FIG. 2 is a cross-section diagram of a typical prior art flip-chip semiconductor device test socket 118, having a Z-axis conductive elastomer sheet 100 as contactor mechanism. (See also FIG. 5, Weiss, et al, supra). The main body 117 of the test socket 118 is precisely positioned by aligning pins 116 on, and is secured to a test PCB 103 by mounting bolts 115. The test PCB 103 has conductive metal contactor patterns 112 located beneath solder bumps 113 of the DUT 105, slightly offset relative to the bump pattern 113. The bumped DUT 105 is precisely positioned relative to the PCB pattern by means of a rectangular cavity formed within the lower center portion of the main body 117 of the test socket 118. Lid 119 is rotated counter-clockwise around pin 111, and held in that position while DUT 105 is placed into position above the Z-axis conductive elastomer sheet 100. After device insertion is completed, lid 119 is rotated clockwise, and then locked in position by latch mechanism 120. The amount of downward force applied to the semiconductor die 105 is controlled by coil spring 121.

Typical semiconductor test sockets that having mechanical features like those shown in FIG. 2, occupy approximately one to four square inches of printed circuit board space. As known in the testing art, for RF semiconductor devices other advanced power management switching integrated circuits, large mechanical structures enclosing semiconductor IC DUT packages affects placement of capacitive bypasses, couplings and other critical components in proximity of the DUT. While such critical components can often be placed on the opposite (bottom) side of the testing printed circuit board (PCB), parasitic inductance of such conductive paths through the PCB often can interfere with proper operation of the DUT.

Also, the complex mechanical designs of typical prior art test sockets (FIG. 2) present a number of fabrication challenges. Fabrication is labor intensive, and high mechanical precision must be maintained, while using conventional mechanical machine shop fabrication techniques and extensive tooling changes. Economically, fabrication costs of such prior art test socket systems typically require minimum quantity orders in multiple thousands of dollars range.

FIG. 3 shows a cross-section representation of another prior art test socket system that utilizes special "Y"-shaped contactor tips 123 on pins embedded in insulated casings 124, anchored to the test PCB 103 by means of solder connections. (See also U.S. Pat. No. 6,819,127, D. R. Hembree.) A DUT 105 is placed in a recessed cavity formed by casing 124. A conductive sheet 128 is laid over the DUT, and a downward force, applied by appropriately shaped clips 127, is transferred to the DUT by means of rigid lid 126 for establishing and maintaining electrical contact between the connector tips 123 and solder ball connectors 108 on the bottom face of the DUT 105.

The test socket systems like those shown in FIG. 3 do reduce fabrication costs and physical size, but at the expense of significantly increased parasitic inductance associated with the long contactor leads 129. Another problem with test socket system like those of FIG. 3 is the apparent lack of compliance range. Also the heights of the solder balls connectors 108 on the bottom face of a DUT typically vary (are not co-planar). Accordingly some solder balls connectors on the DUT may not electrically connect with by the "Y"-shaped contactor tips 123 of the long leads 129 while others may be deformed (damaged) by the connection. The invented test socket system and test socket architecture addresses and overcomes these kinds of prior art difficulties, e.g., the necessity for 'interposer elements 34" for effecting electrical connection between a micro array of DUT connectors and a macro array of extending tips of test socket terminals as taught by Hembree, supra. (See U.S. Pat. No. 6,819,127 FIGS. 3a, 3b & 7b)

Other problems with prior art test socket systems and test socket architectures relate to the increasing complexity and number of input/output connectors of current and evolving integrated circuit packages. Also, end-user demand mandates ever smaller and more compact (thin) volumes for electronic appliances, requiring very small volume chip packages with dimensions ranging from tens to hundreds of microns (μm). These trends necessitate architectural reductions in size of mechanical the elements of IC packages, in particular terminals that interconnect IC packages with other electronic components of a particular appliance.

In the past, test socket manufacturers have relied upon conventional mechanical engineering and associated expensive labor intensive, above-and-beyond machine shop techniques to meet the ever-increasing demand for complex testing system and appropriate architecture for test sockets. Currently developed and contemplated IC/semiconductor packages also come in a variety different shapes, sizes, terminal configurations, and machine specific form factors many of which require specially designed test socket architectures to accommodate final testing stages involved in design, in development, in prototyping and in manufacturing of semiconductor/integrated circuit packages.

Versatile, re-configurable test sockets for testing a wide variety of IC/semiconductor packages [DUT] of different sizes, and terminal styles having re-useable elements are currently unavailable from the test socket industry. In short, alternative advanced manufacturing technologies for test sockets must be developed in order to realize high performance electronic appliances at low manufacturing cost.

SUMMARY OF THE INVENTION

A re-configurable test socket system and test socket architecture are described involving a combination of particular micro elements and re-useable macro elements that can be reused and reconfigured for testing a wide variety of different semiconductor and integrated circuit (IC) DUT packages having different shapes, sizes, and terminal configurations that include:

a Z-axis, conductive elastomer sheet placed over a microarray of connector traces on a surface of the test PCB, for establishing electrical connections with connector traces;

a macro array of guide-pins each having a coaxial annular groove proximate a distal tip, mounted, perpendicularly extending from a flat test-PCB surface macroscopically located around a particular microarray of testing electrically conductive contactor traces, a clamping frame structure having a central throat housing with a flat bottom face and a macro array of parallel guide-pin holes orthogonally penetrating into the bottom face of the frame structure adapted for receiving the macro array of extending guide-pins, each coaxially sized for snugly receiving a guide-pin, at least one spring-wire element embedded and anchored within the clamping frame structure orthogonally intersecting each guide hole positioned for snapping into the annular groove of, and releasably locking onto a guide-pin received in the guide-pin hole, a DUT positioning frame with flat top and bottom faces having a particular, replaceable central positioning cavity with a well sized for receiving and microscopically positioning a particular, semiconductor/integrated circuit DUT, sandwiched between the clamping frame structure and Z-axis, conductive elastomer sheet, also having a macro array of guide-pin holes located and sized for snugly receiving the macro array of extending guided pins, wherein the DUT, within the positioning cavity of the DUT positioning frame, located and oriented by the guide-pin holes receiving the guide-pins, presents a micro array of contactors oriented for electrical connection with at least two of the test micro array of contactors, a pressure applicator received in the throat of the clamping frame structure presenting a flat surface adapted to extend into the central positioning cavity of the DUT positioning frame for transferring a uniform field of pressure onto a DUT positioned within the window of the aligner frame, and means mounted within the throat housing of the clamping frame structure for adjustably applying a force urging the pressure applicator toward the central window opening of the DUT positioning frame when the clamping frame structure is locked onto the extending guide-pins mounted on the test PCB.

Primary aspects and advantages of the re-configurable test socket system and test socket architecture relate to:

The architecture of miniaturized of the re-useable macro scale test socket components that reduce parasitic electrical and magnetic field effects including inductances, capacitances and resistances in conduction through-paths provided by the test socket; and Enhanced alignment accuracy achievable by combining reusable precision macro scale test socket elements for positioning a particular macro element that receives and precisely positioning a micro scale semiconductor/IC DUT package; and Increased versatility attributable to reusable precision macro scale elements of the test socket that allows testing of micro scale IC/semiconductor packages (DUT) limited only by the cross-section area of a pressure applicator received within the throat hosing of the clamping frame structure.

Methods and techniques for fabricating, forming and microscopically aligning the particular central positioning windows of the DUT positioning frames.

An important aspect of the invented test socket system relates to utilization of Z-axis anisotropically conductive, elastomer mediums (sheets) placed between a test Printed Circuit Board (hereinafter referred to as a 'test PCB'), and a DUT package received and microscopically positioned by the central positioning cavity of the DUT positioning frame relative to a micro array of test contactors on a test PCB surface for mechanically establishing electrical connections when compressed between the respective micro arrays of contractors on the test PCB surface and on the bottom, presenting surface of the positioned DUT package without damaging/deforming either contactor array.

Other aspects relate to a locking mechanism for releasably securing the clamping frame structure at a fixed vertical position above the micro array of test contactors on the test PCB consisting of one, or a spaced, parallel pair, of embedded spring-wires that orthogonally intersect each guide-pin hole that snap into coaxial annular grooves proximate the tip of guide-pins received in the respective guide-pin hole penetrating into the bottom surface of the clamping frame structure.

Further aspects the test socket system relate to a pressure applicator coaxially received in the throat of the clamping frame structure that presents a flat surface adapted to extend coaxially onto the central positioning cavity of the DUT positioning frame for transferring a uniform field of pressure onto a DUT package positioned within the cavity responsive to a coaxial pre-set point force impressed from above by a compression spring coaxially contained within the throat housing of the clamping frame structure for coaxially driving a force concentrator plate having a coaxially bead protruding from its bottom surface against the top surface of the pressure applicator when the clamping frame structure is locked at the set vertical position above the micro array of testing contactors on the test PCB A primary advantage of the described test socket stems from a compact macro alignment and latch mechanisms allowing for very small test sockets, having much reduced parasitic inductive, capacitive and resistive affects, that occupies a very small space on the PCB, thus even further reducing the magnitude of resistive and other of undesirable electrical and magnetic field effects that can color the parameters of the DUT being analyzed.

Other advantages of are that the described test socket system can be easily reconfigured to test a wide variety of flip-chip and plastic encapsulated semiconductor devices of various terminal styles.

Still other advantages and aspects of the invented test socket system relate to adaptable inexpensive techniques for precision optical alignment of microscopic DUT contactor arrays to corresponding contactor arrays presented on a surface of a test PCB.

DETAILED DESCRIPTION OF PREFERRED EMBODIMENTS

Features of preferred embodiments the invented test socket and related methods and processes for achieving the advantages and performance improvements of the invented test socket system and architecture are described herein with reference to the accompanying drawings. However, known mechanical and related electrical systems associated with testing systems for semiconductor IC DUT packages are not described in detail.

Figure 1A:
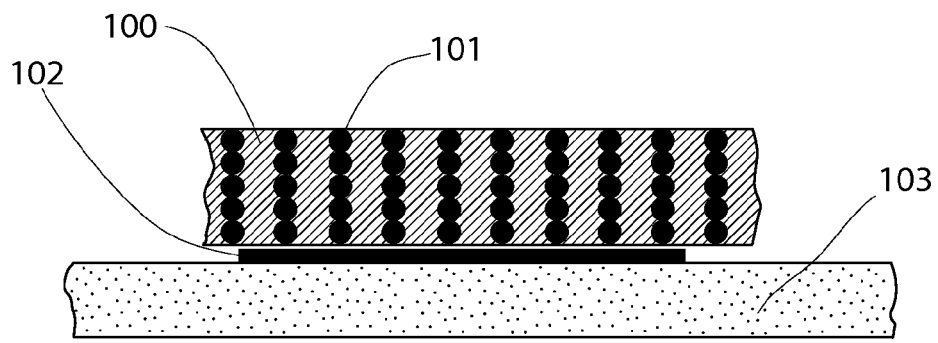
FIG. 1a is a cross-section diagram of a prior art Z-axis anisotropically conductive elastomer contactor sheet having stacked contactor balls positioned between a test PCB and a DUT.
Figure 1B:
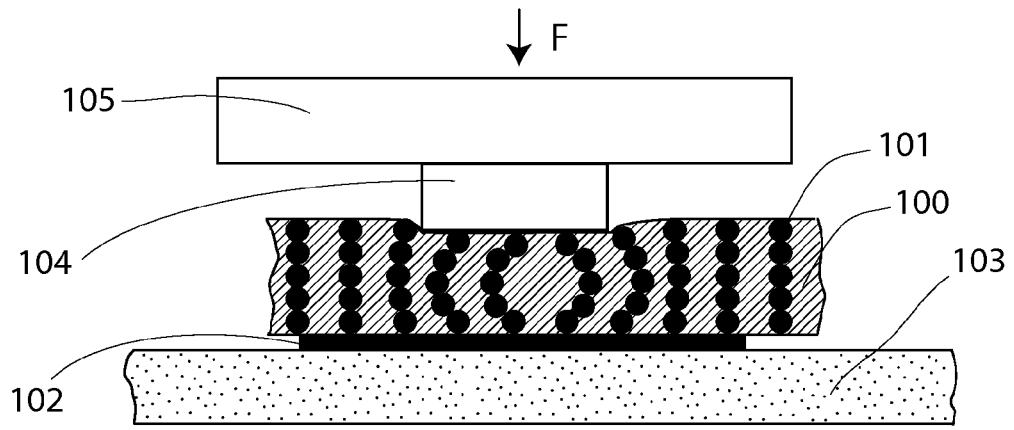
FIG. 1b is a cross-section diagram of a prior art Z-axis-conductive elastomer contactor sheet having stacked contactor balls compressed between a test PCB and a bumped semiconductor DUT showing an applied downward force that compresses the elastomer sheet and causes the contactor balls to buckle.
Figure 1C:
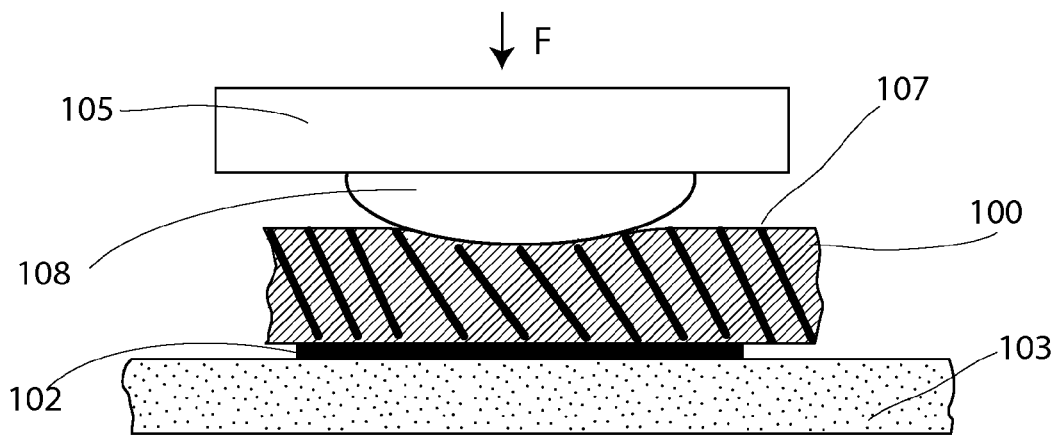
FIG. 1c is a cross-section diagram of components of a prior art Z-axis-conductive elastomer contactor sheet, using tilted conductive pins embedded inside non-conductive elastomer sheet, in a compressed position, placed between the PCB and a bumped semiconductor DUT. An applied downward force compresses the elastomer sheet and causes the contactor pins to tilt further beyond an initial uncompressed tilt angle.
Figure 2:
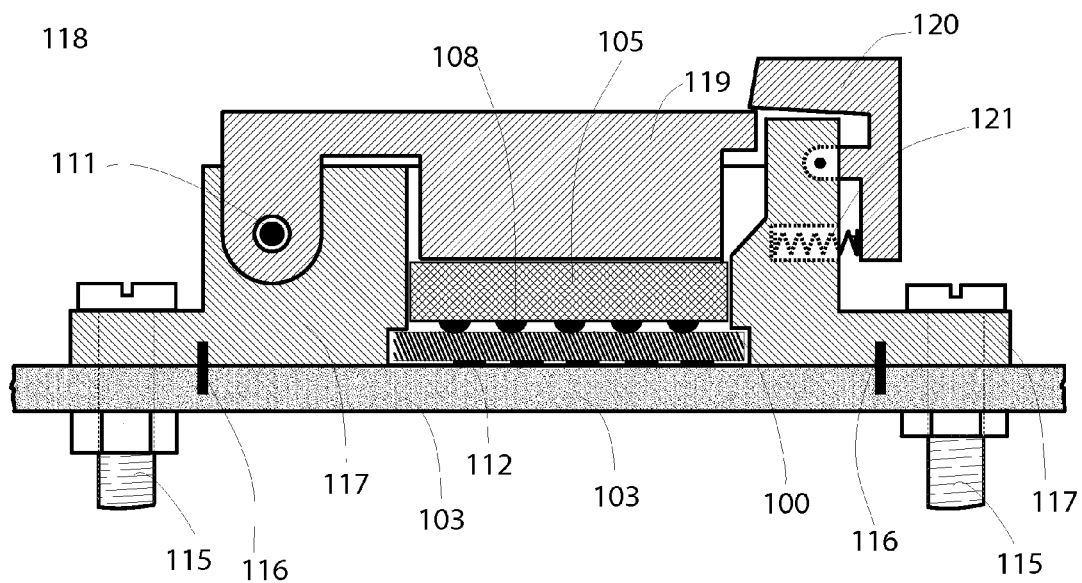
FIG. 2 is a cross-section diagram of components of a typical prior art high-performance semiconductor test socket, using a Z-axis, anisotropically conductive contactor elastomer sheet.
Figure 3:
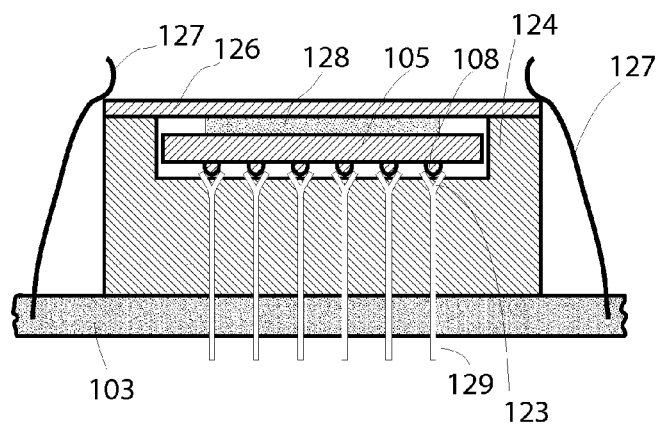
FIG. 3 illustrates a cross-section of components of a relatively low-cost prior art test socket, designed for testing bumped dies, having solder ball terminals. The contactor members, aligner cavity, the force applying plate, the elastomer sheet, and a simple, spring-loaded latch mechanism are illustrated.
Figure 4:
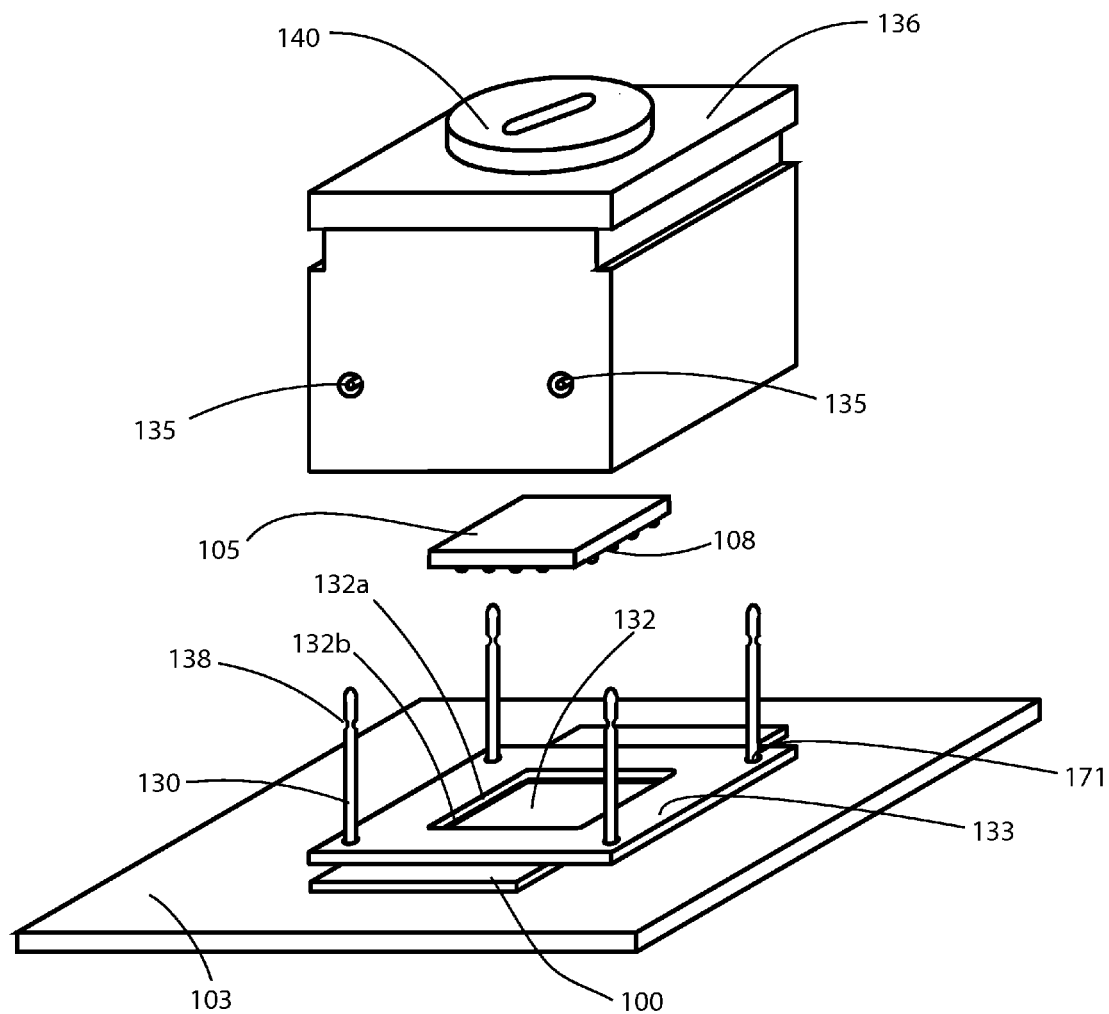
FIG. 4 shows an exploded perspective view of key components of the invented test socket for positioning a DUT package on a flat surface of a test PCB.
Figure 5:
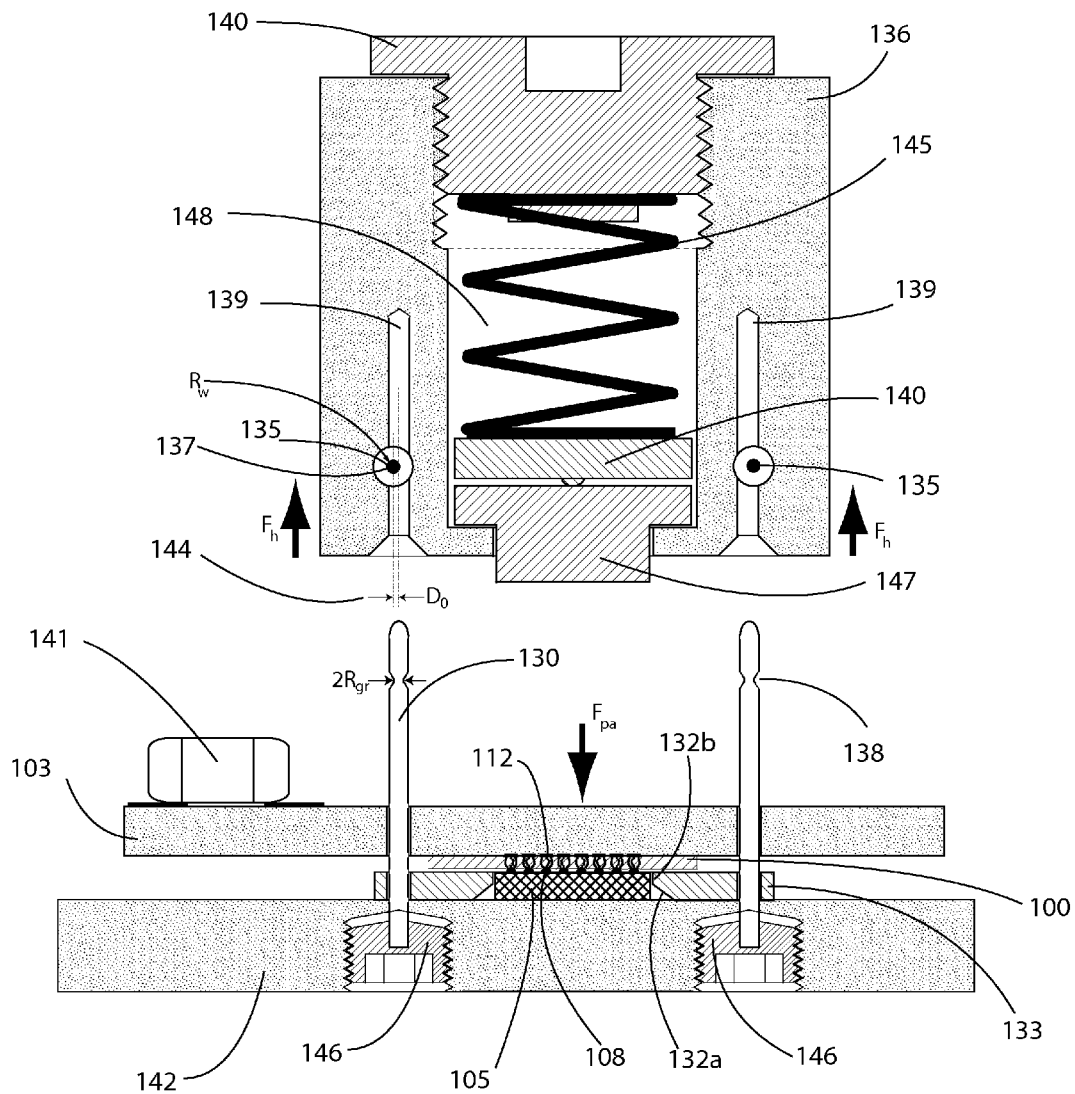
FIG. 5 illustrates a cross-section of internal components of the test socket, where the DUT positioning frame, the Z-axis-conductive elastomer contactor sheet, the test PCB and the clamping frame structure are sequentially stacked and positioned on a metallic heat sink by guide-pins anchored in the heat sink.
Figure 7A:
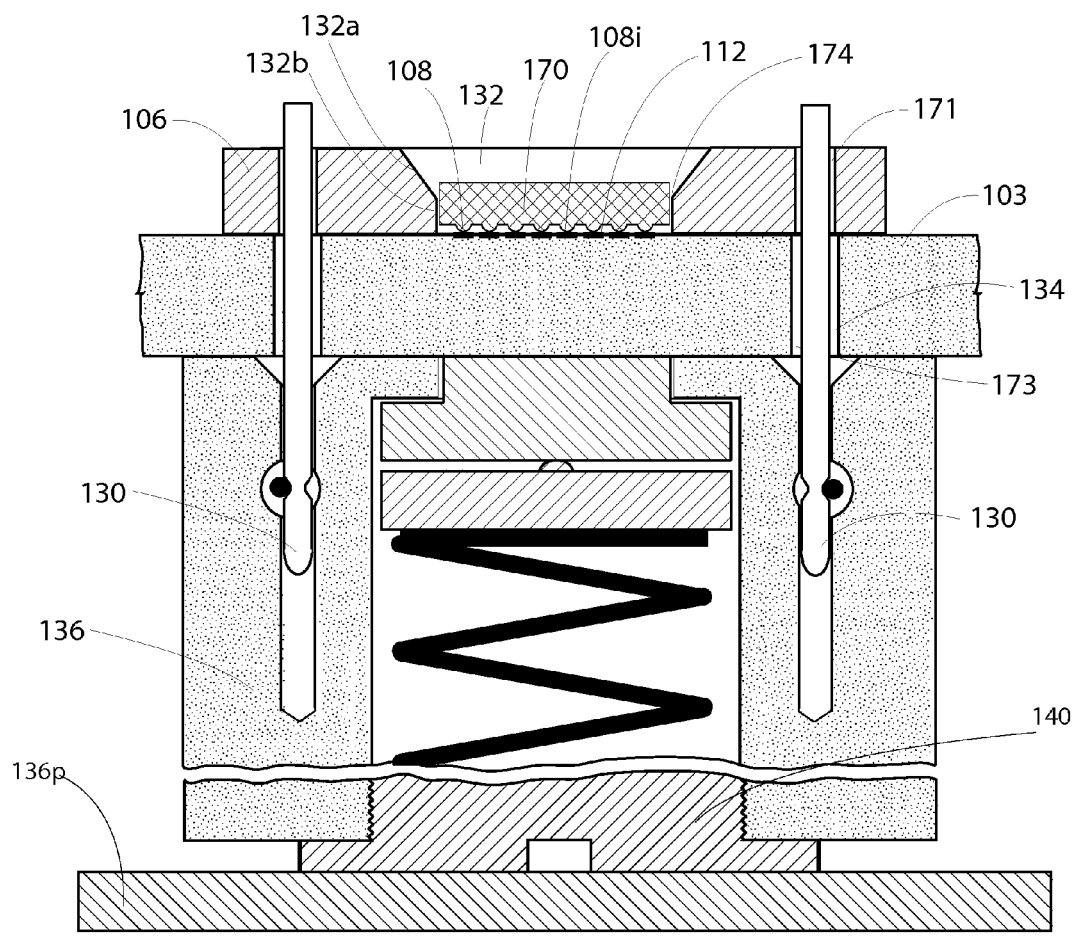
FIGS. 7a &7b illustrates a method for aligning a test socket and a test PCB.

FIG. 4 shows an exploded, perspective view of the architectural components of the invented test socket 150 system for positioning a DUT package 105 having particular perimeter dimensions presenting a planar bottom surface, microarray of electrically conductive connectors 108 for testing on a flat surface of a test PCB 103 presenting a corresponding top surface, planar microarray of electrically conductive connector traces 112 (not shown, see FIGS. 2, 5 & 7a).

In more detail, with reference to FIG. 4, the functionality and advantages afforded by the invented test socket architecture result from a combinations of elements comprising:

a Z-axis, conductive elastomer 100 placed over a micro array of connector traces 112 on the surface of the test PCB 103, for establishing electrical connections with connector traces 112;

a macro array of three or more guide-pins 130 solidly anchored by solder or other means in the test PCB 103 each having an annular 'V'-groove 138 proximate its distal tip extending vertically from the flat surface of the test PCB 103 spaced well outside the perimeter of the micro array of the connector traces 112 for macroscopically, precisely locating the test socket components on the flat surface of the test PCB 103;

a DUT positioning frame 133, having three or more guide-pin holes 134 penetrating through a flat perimeter frame structure 133 located for snugly receiving, and being positioned by the macro array of guide-pins 130, framing a replaceable central positioning cavity 132 with upper, inwardly inclined shoulders 132a tapering into a lower vertical sidewall well 132b particularly sized for snugly receiving the perimeter of a particular DUT package 105 for locating the micro array of electrically conductive connectors 108 on its planar bottom on the surface of the Z-axis, conductive elastomer 100 opposite the corresponding micro array of electrically conductive connector traces 112 (not shown, refer to FIGS. 5, 7b) on the test PCB 103 when positioned by the guide-pins 130 received through the guide-pin holes 134 penetrating through the flat frame structure;

a clamping frame structure 136 having a central housing throat 148 (not shown, see FIGS. 5 & 7a) and a flat bottom face with a macro array of parallel guide-pin holes 171 (also not shown, see FIGS. 7a and 7b) orthogonally penetrating into the bottom face located and sized for snugly receiving the macro array of vertically extending guide-pins 130;

spring-wires 135 each anchored within the clamping frame structure 136 orthogonally intersecting each guide-pin hole 171 positioned for snapping into the annular 'V'-groove 138 of, and releasably locking onto the top end of the received guide-pin for firmly securing the clamping frame structure 136, resting on a flat perimeter frame structure of the DUT positioning frame 133, to the test PCB 103;

a pressure applicator 147 coaxially received in the clamping frame structure throat housing 148 (see FIGS. 5 & 7a) presenting a surface adapted and particularly sized extending out from the bottom face of the clamping frame structure 136 onto the DUT package positioned in the lower vertical sidewall well 132b of the inner positioning cavity 132 for transferring a uniform field of pressure perpendicularly onto the DUT package 105 snugly received in the vertical sidewall well 132b of the DUT positioning frame 133 for compressing the underlying Z-axis conductive elastomer 100 establishing a plurality of electrical conduction through-paths between the respective micro arrays of electrically contactors 108 of the DUT 105 and contactor traces 112 of the test PCB 103;

a compression spring 145, coaxially received in the throat housing 148 of the clamping frame structure 136 compressed (tensioned) between a compression screw 140 screwing coaxially into the throat entrance (see FIGS. 5 & 7a) and a coaxially translating disk-shaped force-concentrator 140 presenting a coaxial hemispherical bead or teat on its bottom surface for converting the distributed force of the compressed spring 145, to a coaxial point force for urging the pressure applicator 147 toward an arresting inner annular shoulder at the exit of the throat 148 when the clamping frame structure 136 is locked onto the guide-pins 130 solidly anchored to the test PCB 103. (See FIG. 4.)

Turning now to FIG. 5, a cross-sectional view of the present test socket system is shown where the clamping frame structure 136, associated guide-pins 130, and DUT positioning frame 133 are re-configured for the purpose of testing high power integrated circuit DUT packages seated on a heat sink for dissipating excess heat generated by the DUT package during testing. In this configuration, an array of four guide-pins 130 are anchored within setscrews 146 that are, in turn received in corresponding threaded setscrew ports drilled into the bottom of a flat gold-plated, copper plate heat sink 142, with the pins 130 perpendicularly extending through the heat sink body above the top surface of the heat sink. The set screws 146 also serve as a fine adjustment mechanism for adjusting the elevation of at least three respective annular locking grooves 138 proximate the tips of the guide-pins 130 that establishes the plane of the clamping frame structure 136 and/or the orthogonal relationship of the internal, coaxial, components housed in its throat 148 relative to the top surface of the heat sink 142.

In particular, extending the guide-pins 138 precisely and securely, macroscopically position, in a vertical stack, the DUT positioning frame 133, a test PCB 103, and the clamping frame structure 136. The DUT package 105 mounted in the inner positioning cavity 132 of the DUT positioning frame 133 rests on the top surface of heat sink 142 for effective heat removal, and microscopically locates the terminals 108 on the top surface of package DUT 105 relative to conductive traces 112 located on the bottom surface of a test PCB 103 for establishing conductive paths via a Z-axis, conductive elastomer sheet medium 100 sandwiched between the package DUT 105 and the test PCB 103 when and the clamping frame structure 136 is locked onto the annular 'V' grooves 138 of the guide-pins 130. As illustrated in FIG. 5, external passive components such as component 141 can be placed onto the topside of PCB 103. Similarly, small-sized components may be placed onto the bottom-plane of PCB 103.

As before, the cylindrical throat 148 of the clamping frame structure 136 coaxially houses a compression spring 145, a coaxially translating disk-shaped force-concentrator 140 having a coaxial hemispherical bead or teat on its bottom surface and a pressure applicator 147. The compression spring compressed (tensioned) by means of a compression screw 140 that screws coaxially into the throat entrance. The force-concentrator 147 converts the distributed force of the compressed spring 145 to a coaxial point force urging the pressure applicator 147 toward an inward extending annular shoulder stop around the bottom exit of the throat housing 148 of frame structure 136.

The pressure applicator 147 has an annular shoulder that rests on the annular shoulder stop at the bottom throat exit with an extending nose coaxially protruding out the throat exit below the bottom face of the clamping structure 136. The tip of the pressure applicator nose is particularly sized macroscopically for transferring a uniform field of pressure perpendicularly onto the test PCB 103, directly above the conductive traces 112 on its bottom surface.

In more detail, when the clamping frame structure 136 locks onto of the guide-pins 130 at an elevation determined by the annular 'V' grooves 138 around the guide-pins secured by the spring-wires 135, the pressure applicator 147 raises off the annular shoulder stop at the throat exit of the clamping frame structure 136, and applies a pre-determined force ($F_{pa}$) sufficient to compress the interposed Z-axis, conductive elastomer sheet medium 100 between the test PCB 103 and the DUT package 105 for establishing electrical conductive paths between the terminals 108 on the top surface of package DUT 105 and the conductive traces 112 located on the bottom surface of the test PCB 103.

In its preferred embodiment, the tip of the nose of the pressure applicator 147 is planar, having a rectangular cross-section when viewed from the bottom comparable to that of a typical set of particular rectangular DUT packages 105. The nose tip of the pressure applicator 147 can have other cross-section configurations, e.g., circular, hexagonal, or other cross-sections conforming to that presented by a particular set of DUT packages being tested.

Practitioners in design and application of integrated semiconductor packages should also appreciate that a pressure applicator 147 can also function as a heat sink if composed of Copper or other thermally conductive material to for cooling a DUT 105. In particular, the test socket architecture can be configured as shown in FIG. 4 where the pressure applicator 147, composed of copper with a polished, planar, gold plated nose tip face, contacts the DUT for dissipating heat generated by the DUT during testing. (The Gold plating prevents oxidation of the copper.) Alternatively, Aluminum or other suitable thermally conductive material may be used.

Where the DUT packages are highly sensitive to capacitance, as is the case for radio frequency (RF) DUT packages, the pressure applicator 147 is preferably composed of an electrical insulative material, e.g., Alumina, and Aluminum nitrate. Other suitable insulative materials for the pressure applicator 147 include polymer plastics having appropriate mechanical, thermal, and insulative properties suited for minimally affecting the parameters expected to be encountered in testing a particular class of semiconductor DUT packages.

Figure 6A:
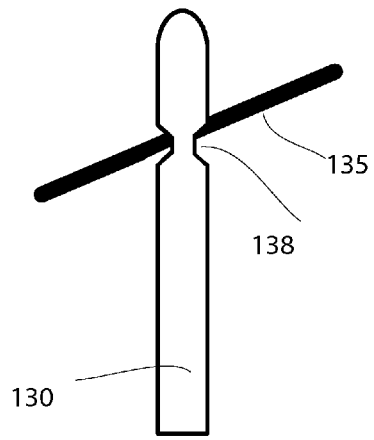
FIG. 6a is a perspective view a compact latching mechanism for securing a test socket to a test PCB where the guide-pins have an annular "V"-groove proximate their distal tips that are captured by single spring-wires anchored in the clamping frame structure of the test socket that orthogonally intersect each receiving guide-pin hole.
Figure 6B:
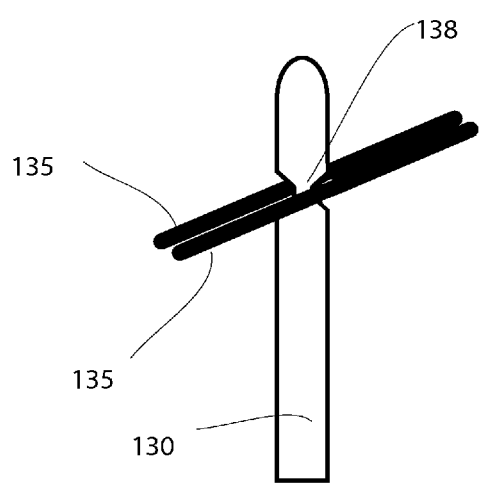
FIG. 6b is an alternative embodiment perspective view of a compact latch mechanism of FIG. 6a where dual parallel spring-wires anchored in the clamping frame structure of the test socket orthogonal intersect each receiving guide-pin hole for capturing the annular "V"-grooves proximate the distal ends of the inserted guide-pins.

FIGS. 6a & 6b show perspective views of two spring-wire mechanisms for locking onto the guide-pins 130, supporting and positioning the clamping frame structure 136 at a particular elevation relative to an adjacent face of a test PCB 103. As shown, the spring-wires 135 snap into coaxial annular 'V'-grooves 138 proximate the tips of the pins 130.

The functional attributes of such spring-wire locking mechanisms are small size and high precision. In a typical implementation, for spring-wire(s) 135 diameters of 0.009" (~0.23 mm) and guide-pin 130 diameters can range from 0.020" (~0.51 mm) to 0.04" (~1 mm) range. Achieving small physical size is central to reduction of parasitic electrical/magnetic affects of test socket systems. Small physical size is also an important for burn-in applications where PCB space is at premium.

FIG. 6a shows an embodiment of the latch mechanism where a single spring-wire 135 is oriented orthogonally relative to a guide-pin 130 offset from the longitudinal axis of the guide-pin hole pre-determined amount, snaps into the annular groove 138 near the pin tip adapted to accommodate the diameter of the particular spring-wire 135.

FIG. 6b shows an embodiment of the latch mechanism where a spaced pair of parallel spring-wires also oriented orthogonally relative to a guide-pin 130 snap into an accommodating annular groove 139 near the pin tip. The advantages of this embodiment are higher holding forces for securing the DUT package, and forces that inherently center the guide-pin 130 received in the guide-pin holes.

Figure 6C:
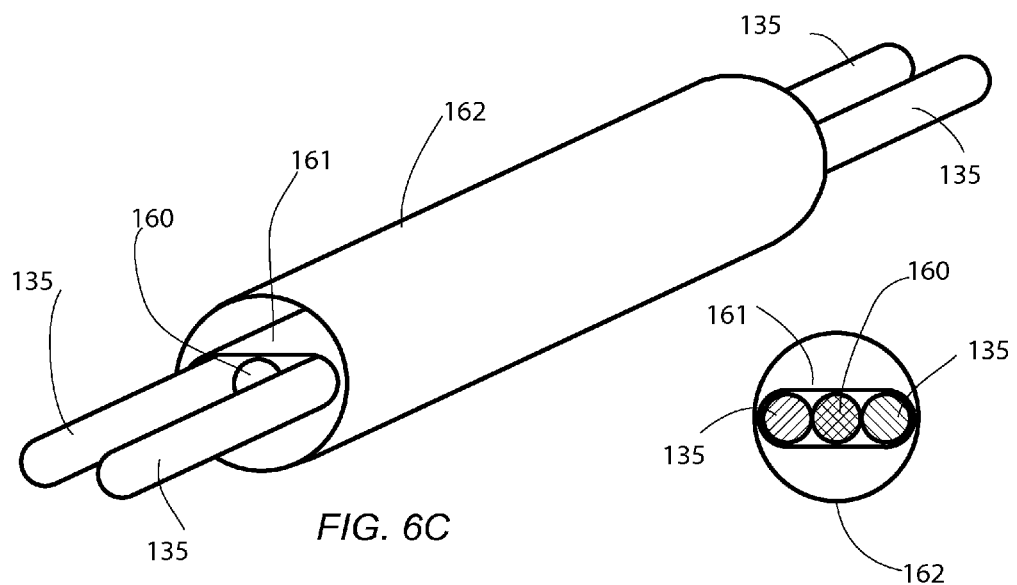
FIGS. 6c & 6d are a perspective view and a cross-section view of a compact spaced pair spring-wire assembly that can be anchored in the clamping frame structure of the test socket for orthogonal intersecting a pair of guide-pin hole capturing the annular "V"-grooves proximate the distal tips of inserted guide-pins.
Figure 6D:
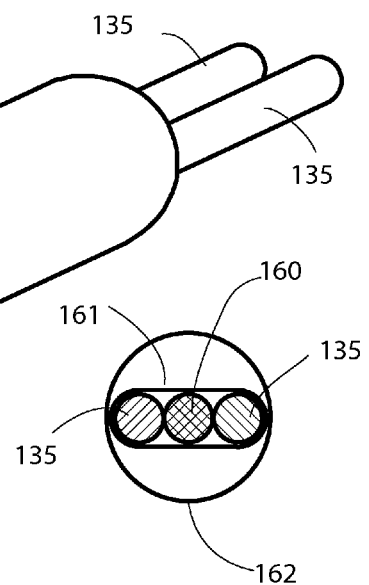

FIGS. 6c & 6d show details of a simple, pre-fabricated assembly, a spaced pair of spring-wires 135 held apart by a shorter spacer wire 160 solidly encased within an inner oval-shaped shell 161 that, in turn, is solidly encased within an outer circular shell 162. The spring-wires 135, extending from each end of the assembly are parallel with a spacing set by the diameter, ($D_{sw}$), of the spacer wire 160.

Referring back to FIG. 5 showing a single wire latching mechanism, the longitudinal axes of the single spring-wires 135 are secured in anchor holes 137 having a radius ($R_a$) drilled into the body of the clamping frame 136 orthogonally intersecting through each guide-pin hole 137 offset from the longitudinal axis of the particular guide-pin hole 139 by an offset dimension 144, ($D_o$), where $D_o$ is less than the sum of the radius of the spring-wires 135, ($R_w$) and the radius of guide-pin 130 at the bottom of the "V" groove 138 ($R_{gr}$), i.e., $D_o < (R_w + R_{gr})$.

For a spaced pair of spring-wires of FIG. 6c, the diameter of spacer wire 160, $D_{sw}$, is determined by the diameter of spring-wire 135, $D_w$, and the diameter $D_{gr}$ of the guide-pin 130 at the bottom of "V" groove 138, i.e. $D_{sw} < D_w + D_{gr}$. The anchor hole 137 diametrically intersects through the guide-pin hole 139. The diameter of the spacer wire 160 ($D_{sw}$) is chosen to establish the desired offset of the spaced pair of spring-wires in the particular intersected guide-pin hole 139, and in all cases, should be less than the diameter $D_w$ of spring-wire 135, plus the diameter $D_{sw}$ of guide-pin 130 at the bottom of "V" groove 138, i.e. ($D_{sw} < D_w + D_{gr}$).

Accordingly, as a guide-pin 130 slides into a guide-pin hole 139, the spring-wire(s) 135 initially are each displaced laterally into resulting annular recesses drilled out of the sidewall of the guide-pin hole, and then snap into the annular "V" groove 138 around the guide-pin 130 as it comes into registry near the top of the pin locking onto the guide-pin. The lateral displacement ($d_l$) of the spring-wire(s) 135 snapping into the annular 'V' groove decreases by an amount determined by the ($R_w$) of the spring-wire and the particular dimensions of the 'V' groove 138. The resultant 'holding force' of the spring-wire(s) locking onto the guide-pin is determined by the residual bending displacement of the spring-wire(s) 135, the radius of spring-wire 135, $R_w$, and the offset 144, $D_o$.

The holding force of different types and sizes of latching mechanisms typically can be calculated/predicted using well-known computer mechanical design/simulation programs. In all cases holding force, ($F_h$) of each individual spring-wire-to-"V" groove interface required of the latching mechanism for securing the clamping frame structure 136 at a particular elevation relative to an adjacent face of a test PCB 103 must always be greater than the force ($F_{pa}$) urging the raised pressure applicator 147 at that particular elevation toward the annular shoulder stop at the throat exit of the clamping frame structure 136, divided by the number of spring-wire-to-"V" groove interfaces, i.e., ($F_h > F_{pa}$). As explained above $F_{pa}$ must be sufficient to compress the interposed Z-axis, conductive elastomer sheet medium 100 to establish electrical conductive paths between the micro arrays of contactors on the offered face of the package DUT 105 and the presented face of the test PCB 103.

The choice between latch mechanisms with a single wire or a spaced-pair of spring-wires primarily depends the size of the DUT package 105, i.e., the size and architecture of the particular semiconductor/integrated circuit package specified as particular component of an electronic appliance. For example, where a clamping frame structure 136 has an 8 mm×8 mm foot-print PCB on the test PCB 103, that can accommodate a particular DUT, a single spring-wire latch mechanism can provide the required holding force $F_h$, and therefore be preferable because of small size, because of less parasitic electrical/magnetic field affects on measured parameters. However, where the size of the DUT 105 exceeds 3 mm×4 mm, the clamping frame structure 136 size (foot-print) commensurately increases in size. Where test PCB area is not critical factor then the size (foot-print) of the clamping frame structure 136 can be increased. However, the holding force $F_h$ can be arbitrarily increased by choosing larger clamping frame structures. Accordingly, spaced-pair spring-wire latching mechanisms would be a preferable choice for larger DUT sizes.

Holding force $F_h$ may also increased by creating multiple "V" grooves on individual guide-pins and corresponding spring-wires intersecting the macroscopic array of guide-pin holes penetrating into the bottom face of the clamping frame structure.

FIG. 7a shows cross-sectional view of the invented test socket architecture where the clamping frame structure 136, associated guide-pins 130, and DUT positioning frame 133 are configured for optical aligning a planar, micro array of contactors traces 112 on a test PCB 103 and a particular central positioning cavity 132 of a DUT positioning frame 133.

In more detail, the clamping frame structure 136 is inverted, and independently secured with its flat bottom face providing a stationary X-Y support platform 136p. At least three guide-pins 130 with spaced annular V'-grooves 138 proximate each tip are inserted into and latched onto by single spring-wires 135 snapping into the annular V'-grooves 138 proximate the tip of the inserted pins presenting an array of at least three guide-pin 130 perpendicularly extending out from the X-Y support platform 136p. An array of at three least guide-pin mounting-ports 134 located for receiving the array of extending guide-pin 130 are drilled through the test PCB 103 symmetrically surrounding the planar microscopic array of contactors 112 traces on the face a test PCB 103. The test PCB 103 with its offering face, facing out, is then placed on the X-Y support platform 136p initially positioned by the array of extending guide-pin 130 received in the guide-pin mounting-ports 134 drilled through the test PCB 103. The guide-pin mounting-ports 134 should have respective radii ($R_{PCBH}$) macroscopically greater than the radii ($R_p$) of extending guide-pins 130 for loosely receiving the pins to allow limited X-Y positioning readjustments of the test PCB 103 on the support platform 136b, i.e., ($R_{PCBH} > R_p$). The DUT positioning frame 133 is then seated on the test PCB 103 with the lower vertical sidewall well 132b of the central positioning cavity 132 seating on the surface of the test PCB 103 relatively aligned with the micro array of conductive traces 112 on the offering face of the test PCB 103 by the extending array of guide-pin base 130. The radii ($R_{DPFH}$) of the guide-pin holes 171 drilled through the flat perimeter frame structure 133 of the DUT positioning frame are sized for snugly receiving the guide-pin 130, i.e., ($R_{DPFH} \geqq R_p$).

The radii of guide-pin holes 134 are slightly oversized relative to the radii of guide-pins 130 in order to facilitate X-Y plane alignment with the DUT positioning frame-guide-pin structures.

The seated, DUT positioning frame 133 is temporarily located and oriented by the shanks of the extending guide-pins.

An optically transparent, exact replica 170 of a particular DUT package 105 is created, that has images 108i duplicating the geometric pattern of the micro array of connectors 108 on the presenting planar face of the DUT package 105.

The transparent replica 170 is then fitted into, and microscopically oriented by the vertical sidewall well 132b of the central positioning cavity 132 of the DUT positioning frame 133. Care must be taken when fitting the replica 170 into the vertical sidewall well 132b of the central positioning cavity 132 to assure that replica 170 is congruently oriented relative to the perimeter vertical side walls of the well 132b.

With the transparent replica 170 congruently in place within the well 132b, using a stereo-zoom microscope, or closed-loop machine vision/positioning system, the X-Y position of micro array of contactors traces 112 on the test PCB 103 is adjusted into optimal registry with the geometric pattern of images 108i in the transparent replica 170 by moving the PCB 103 on the X-Y support platform 136p.

Upon achieving an optimal pattern registry (match) between the geometric images 108i in the transparent replica 170 and the corresponding contactor traces 112 on the test PCB 103, the test PCB 103 is temporarily secured anchored/fastened onto the to the DUT positioning frame 133 by means of an adhesive gel, solder, or conventional mechanical means.

The clamping frame structure 136 latched to the received guide-pins 130 is then removed, re-inserted into the guide holes from the opposite (top) side of the PCB 103 and the test PCB is permanently secured/fastened to the shanks of the guide-pins 130 extend out from the test PCB 103 opposite the DUT positioning frame 133. The temporary means securing the test PCB 103 to the DUT positioning frame 133, and the DUT positioning frame 133 to the shanks of the guide-pin shanks are removed.

Figure 7B:
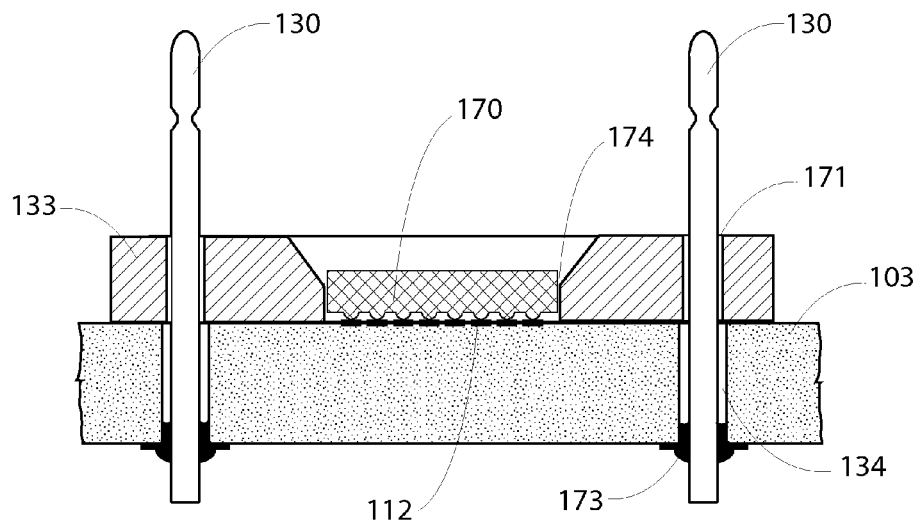

FIG. 7b shows a cross-sectional view of the resulting test socket architecture without the clamping frame structure where the guide-pins 130 anchored/fastened mounted in the test PCB 103 is assembled with the DUT positioning frame 133 with transparent replica 170 still in the well 132b of the central positioning cavity 132. The sizing tolerances indicated at 171 between the respective radii ($R_p$) of the guide-pins 130 can be tightly controlled by laser drilling the guide holes of guide frame 133. The radii of guide holes 134 are deliberately over-sized in order to allow for accumulative error compensation by means of optical alignment process. The mechanical accuracy of the transparent replica 170, positioning frame 133, and the gap 174 between them can be controlled by means of low-cost micro-molding or photo-etching process within +/−5 μm.

Those skilled in the arts of testing and measurement should appreciate that the described test socket system and test socket architecture utilizes mechanically independent components. The clamping frame structure 136 and its internal components, the DUT positioning 133 and internal structures are united to function by precise, macroscopically located guide-pin holes drilled into and through a test PCB 103, the clamping frame structure 136 and the DUT positioning frame 133 by guide-pins 130. This is an important attribute because each semiconductor, integrated circuit chip or die-DUT package is unique with variances of both dimensions and aspect ratios. The described test socket system with reusable configurable architecture is easily adapted to different Test PCBs and different DUT packages by custom fabricating the DUT positioning frame 133 and transparent replica 170, without requiring any modifications of any of the other components.

Figure 8A:
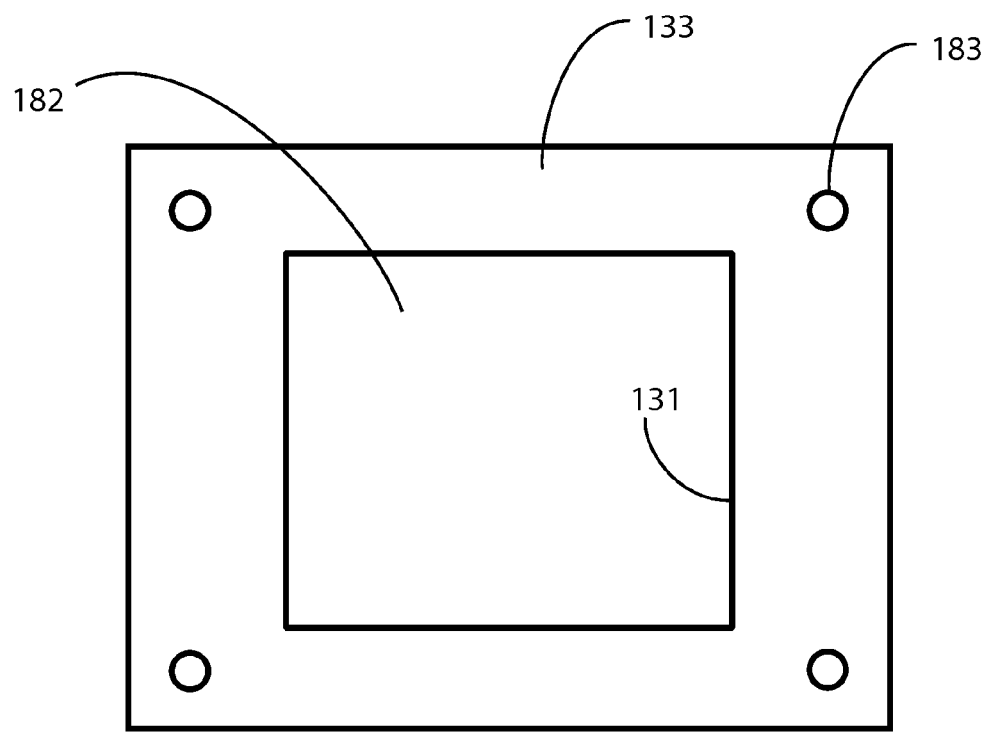
FIG. 8a is a top-view of a DUT positioning frame that receives and orients the DUT in the test socket.
Figure 8B:
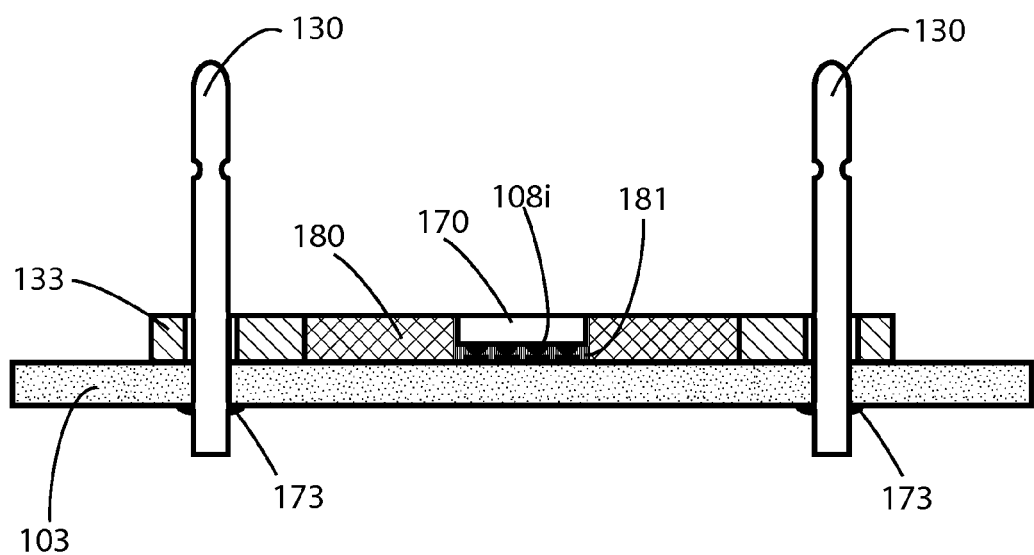
FIG. 8b is a cross-section view of a micro-molding process for creating a marginally oversized rectangular window within the DUT positioning frame that receives and microscopically, precisely orients the DUT for presenting micro array of contactors for making electrical connections with a corresponding micro array of connectors on the surface of the test PCB.

The DUT positioning frame 133 can also accommodate a wide range of DUT sizes. As shown in FIGS. 8a and 8b, a DUT positioning frame 133 has a wide flat perimeter frame structure 131 with four aligning guide-pin holes 134 symmetrically located relative to a center of a large framed rectangular window 182. The DUT positioning frame 133 is seated on a test PCB 103 positioned by four guide-pins 130 mounted/anchored in the test PCB 103 orthogonally extending from a planar face presenting a microarray of contactor traces 112 symmetrically located relative to a center of the microarray of contactor traces 112. A transparent replica 170 of a particular parent DUT package 105 with images 108$i$ duplicating the pattern of the microarray of connectors 108 on the DUT package 105 is placed on the surface of the test PCB within the window 182 and positioned optically, as before, to optimal registry with the underlying microarray pattern of trace contactors 112 on the face of test PCB 103 using a stereo-zoom microscope, and/or closed-loop machine vision/positioning systems. In this case, the transparent replica 170 is secured to or held on the surface of the test PCB 103 at the registry position over the underlying microarray of trace contactors 112. The window is then filled with an appropriate micro-molding compositions and allowed to set, and/or cure. Once the micro-casting composition has set/cured, the DUT positioning frame 133 is lifted off the test PCB 103, the transparent replica 170 is carefully removed out of the encasing set/cured micro-casting composition creating a well 132b for receiving and microscopically positioning the parent DUT package 105 on the testing PCB for measuring its I/O parameters.

Such a micro molding techniques routinely achieve micrometer-scale accuracies at low manufacturing cost currently only attainable in sophisticated conventional fabrication facilities, at prohibitively high cost. The present invention overcomes this problem at low cost by employing advanced micro-molding and micro-casting techniques. (See U.S. Pat. No. 7,655,307, Kim, et al. for a discussion of appropriate molding compositions and techniques.)

In fact, the major problem in the manufacturing of test sockets for semiconductor/integrated circuit DUT packages relate to large arrays of input output terminals (connectors), with pitches well below 500 μm range that requiring tighter tolerances, and consequent higher manufacturing expense because alignment inaccuracies PCB-to test socket-DUT have significant impact on overall performance a test system. The invented test socket system and associated test socket architecture solves these problems in a highly cost-effective manner, by relying upon laser cutting and micro-molding techniques for fabricating DUT positioning frames, allowing for cost-effective optical alignment of DUT package on test PCB within +/−5 μm.

Although only a few embodiments of the invention have been described in detail, it should be appreciated that the described test socket system and associated test socket architecture may be implemented in many other forms without departing from the spirit or scope of the invention. For example, the various embodiments described herein are sometimes illustrated with distinctive and different features. The present invention, however, contemplates its utilization for testing a wide variety of integrated circuit packages, having leaded, Quad Flat No-lead (QFN) and other terminal styles.

There are alternative ways of implementing the methods and apparatus of the invented test socket system and the described test socket architecture and related methods and processes. For example, as described, the architecture of the invented test socket is configured and designed primarily for accommodating flat contactor-spring mechanisms as well as a wide variety of Z-axis conductive interposer systems. Other semiconductor DUT packages having different features, terminal configurations, can nevertheless, be accommodated by slight macro scale alterations made to the DUT positioning frame for providing means for allowing electrical connection between respective arrays of contactors on a face of a semiconductor/IC DUT package and a test PCB contactor surface. The macro components of the described test socket system can scaled upward and downwards to match very small and very large semiconductor bumped dies, and DUT packages having solder ball, copper pillar, leaded, silver and/or gold surface terminals.

In, particular, it should be recognized that skilled engineers and designers can specify different configurations for the described mechanisms implement by the invented test socket system that performs substantially the same function, in substantially the same way, to achieve substantially the same result as those components described and specified above. Similarly, the respective elements described for effecting the desired functionality of the invented test socket system may be configured differently, per constraints imposed by different mechanical systems, yet perform substantially the same function, in substantially the same way, to achieve substantially the same result as those components described and specified by the Applicant above. Accordingly, while mechanical components suitable for implementing the invented improvements may not be exactly described herein, they may fall within the spirit and the scope of invention as described and set forth in the appended claims.

I claim:

1. Elements of a re-configurable test socket system comprising, in combination:
   a) a test printed circuit board (PCB) having a particular planar microarray of electrically conductive, contactor traces on a presenting planar surface;
   b) an array of mounted guide-pins perpendicularly extending out from the presenting planar surface of the test printed circuit board (PCB) macroscopically located around the particular planar microarray of electrically conductive contactor traces;
   c) a DUT positioning frame with a flat top and bottom perimeter frame surrounding a particular, replaceable positioning cavity structure having a bottom well sized for receiving and microscopically positioning a particular, semiconductor/integrated circuit DUT, and having a macroscopic array of guide-pin holes orthogonally drilled through the flat frame, located and sized for snugly receiving the macroscopic array of extending guided pins wherein the particular DUT received within the positioning cavity of the DUT positioning frame, is oriented and located by the guide-pin holes through the frame receiving the guide-pins, seated on the presenting planar surface of the test printed circuit board (PCB) for presenting a microarray of contactors facing out from the bottom well oriented for electrical connection with at least two of the test microarray of contactor traces on the test printed circuit board (PCB);
   d) a Z-axis anisotropic conductive elastomeric sheet placed between the microarray of connector traces on the presenting planar surface of the test printed circuit board (PCB) and the microarray of contactors presented by the particular DUT for establishing electrical connections between the respective microarrays of test contactor traces on the presenting planar surface of the test printed circuit board (PCB) and contactors of the particular DUT;

e) a clamping frame structure providing a throat housing with a flat bottom face and a macroscopic array of parallel guide-pin holes orthogonally penetrating into the bottom face of the frame structure located and coaxially sized for snugly receiving the macroscopic array of extending guide-pins for locating and positioning the throat housing in macroscopic registry around the particular microarray of contactor traces on the test printed circuit board (PCB);

f) a releasable locking means anchored within the clamping frame structure for providing a holding force ($F_H$) firmly securing the clamping frame structure to the test printed circuit board (PCB) with its bottom face seated on, and oriented parallel to the top and bottom faces of the DUT positioning frame;

g) means mounted within the throat housing of the clamping frame structure for applying a force ($F_{PA}$) for uniformly compressing the Z-axis anisotropic conductive elastomeric sheet between the test printed circuit board (PCB) and the particular DUT to establish electrical conductive paths between the microarray of connector traces on the test printed circuit board (PCB) and the microarray of connectors presented by the particular DUT where the holding force ($F_H$) is greater than the force ($F_{PA}$).

2. The elements of the re-configurable test socket system of claim 1 wherein the mounted macroscopic array of guide-pins are anchored to the test printed circuit board (PCB), and the bottom face of the clamping frame structure seats on the top face of the DUT positioning frame.

3. The elements of the re-configurable test socket system of claim 1 and further including:

h) a heat sink body presenting a planar anvil face wherein:
   i the mounted macroscopic array of guide-pins are anchored within the heat sink body and extend orthogonally out from the anvil face of the heat sink body;
   ii the top face of the DUT positioning frame is seated on the anvil face of the heat sink positioned by the array of extending guide-pins received in its macroscopic array guide-pin holes, and the DUT received within the bottom well of the positioning cavity of the frame presents a microarray of contactors facing out from the bottom well of the DUT positioning frame;
   iii the test printed circuit board (PCB) has a macro array of guide-pin holes located and sized for snugly receiving the macroscopic array of extending guided pins macroscopically located around the particular microarray of conductive contactor traces, and is seated, positioned by its array of guide-pins holes receiving the array of guide-pins, presenting the microarray of conductive contactor traces on the presenting planar surface, oriented for electrical connection with at least two of the microarray of conneceters of the DUT;
   iv the Z-axis anisotropic conductive elastomeric sheet is placed between the microarray of connector traces on the planar presenting surface of the test printed circuit board (PCB) and the microarray of contactors of the DUT facing out from the bottom well of the positioning cavity structure of the DUT positioning frame for establishing electrical connections with the connector traces;
   v the bottom face of clamping frame structure seats, positioned by its guide-pin holes receiving the extending guide-pins, on a flat surface of the test printed circuit board (PCB) parallel to and opposite the planar presenting surface of the test printer circuit board (PCB) and is firmly secured by the releasable locking means to the heat sink body sandwiching the test printed circuit board and the Z-axis anisotropic conductive elastomeric sheet between it and the anvil surface of the heat sink body.

4. The elements of the re-configurable test socket system of claim 3 wherein each guide-pin is anchored within a setscrew that are, in turn, received in a macroscopic array of threaded setscrew ports penetrating into the heat sink body orthogonal to the anvil surface for adjusting respective elevations of distal tips of the guide-pins extending out from the anvil surface of the heat sink body.

5. The elements of the re-configurable test socket system of claim 1 wherein:
   i the guide-pins, each having a radius $R_P$, are mounted in the clamping frame structure, being snugly inserted into the macroscopic array of guide-pin holes orthogonally penetrating into its flat bottom surface and anchored by the releasable locking means with the guide-pins extending orthogonally out from the bottom face of the of the clamping frame structure;
   ii the clamping frame is inverted and independently secured for converting its flat bottom face into a stationary X-Y support platform;
   iii a macroscopic array of guide-pin anchoring holes corresponding to the macroscopic array guide-pins extending orthogonally out from the bottom face of the of the clamping frame structure are orthogonally drilled through the test printed circuit board (PCB) each having a radius $R_{PCBH}$ greater than the radius ($R_P$) of the corresponding guide-pin, i.e., ($R_{PCBH} > R_p$), for allowing adjustment in an X-Y plane on the stationary X-Y support platform provided by the bottom face of the clamping frame structure;
   iv the test printed circuit board (PCB) is seated on the X-Y support platform provided by the bottom face of the clamping frame structure loosely positioned and oriented on the by the macro array of guide-pins extending through the corresponding array of guide-pin anchor holes with its planar presenting surface presenting a particular planar microarray of testing electrically conductive contactor traces facing out;
   v a DUT positioning frame with its bottom well of a particular, replaceable positioning cavity structure containing an optically transparent, exact replica of a particular DUT is seated on the surface of the test printed circuit board (PCB) located, positioned, and temporarily fastened to shanks of the macroscopic array of extending guide-pins received through its macroscopic array of guide-pin holes orthogonally communicating through its frame, each such guide-pin hole having a radius ($R_{DPFH}$) sized for snugly receiving a corresponding guide-pin, i.e., ($R_{DPFH} \geq R_P$);
   vi the X-Y position of microarray of contactors traces on the planar presenting surface test of the printed circuit board (PCB) are adjusted into an optimal optical registry position with a geometric pattern of images of the microarray of contactors presented by the particular DUT in the transparent replica by moving the test printed circuit board (PCB) in an X-Y plane on the X-Y support platform, and, at the optimal optical registry position, the test printed circuit board (PCB) is temporarily fastened to the DUT positioning frame;

whereupon the clamping frame structure is released by the locking means for allowing:
(1) the macroscopic array of guide-pins with shanks temporarily fastened to the DUT positioning frame and the test printed circuit board (PCB) support temporarily fastened to the DUT positioning frame to be removed from the X-Y support platform provided by the bottom face of the clamping frame structure;
(2) the test printed circuit board (PCB) to be permanently anchored to shanks of the macroscopic array guide-pins oppositely extending out through the macroscopic array guide-pin anchoring holes drilled through the test printed circuit board (PCB), and
(3) the DUT position to be unfastened from the test printed circuit board (PCB) and the shanks of the guide-pins extending through its guide-pin holes and removed.

6. A technique for fabricating a particular, replaceable positioning cavity structure having a bottom well sized for receiving and microscopically positioning a particular, semiconductor/integrated circuit DUT within a DUT positioning frame comprising the steps of:
a) drilling a macroscopic array of at least three guide-pin holes orthogonally though a wide flat perimeter frame of a DUT positioning frame symmetrically located relative to a center of a large opening defined within the perimeter frame corresponding, in position and orientation, and sized to snugly receive a macroscopic array of at least three guide-pins orthogonally extending out from a planar face of a test printed circuit board (PCB) symmetrically located relative to a center of a microarray of electrical contactor traces on a presenting surface of the planar face of the test printed circuit board (PCB);
b) seating the flat perimeter frame of the DUT positioning frame on the planar face of the test printed circuit board (PCB) oriented by the guide-pins snugly received though the corresponding macroscopic array of guide-pin holes for macroscopically locating the large opening defined within the flat perimeter frame centrally around the microarray of contactor traces presented on the presenting surface of the test printed circuit board (PCB);
c) creating a transparent replica of the particular DUT, duplicating a geometric pattern of images of a microarray of connectors presented on a planar face of that DUT,
d) placing the transparent replica of the DUT on presenting surface of the test printed circuit board (PCB) within the large opening defined within the flat perimeter frame proximate the center of the large opening;
e) microscopically manipulating, moving and orienting the transparent replica of the DUT to achieve a position of optimal optical registry with a geometric pattern presented by the microarray of contactors traces on the presenting surface of the test printed circuit board (PCB) and the geometric pattern of images of the microarray of connectors duplicated in the transparent replica;
f) holding the transparent replica of the DUT to the planar face test printed circuit board (PCB) at the position of optimal registry of the geometric pattern presented by the microarray of contactors traces on the planar face test printed circuit board (PCB) and the geometric pattern of images of the microarray of connectors duplicated the transparent replica;
g) filling the large opening defined within the perimeter frame corresponding with a micro-molding composition encasing the transparent replica of the DUT secured at the position of optimal registry;
h) allowing micro-molding composition to set, and/or cure;
i) lifting the DUT positioning frame up from and off the planar face of the test printed circuit board (PCB),
j) removing the transparent replica of the DUT from the encasing set/cured micro-casting composition creating a bottom well opening out a bottom face of the DUT positioning frame for receiving and microscopically positioning the DUT on the testing printed circuit board (PCB) for measuring its I/O parameters.

7. The method of claim 6 and further including the step of:
k) orthogonally cutting a sample plurality of particular, semiconductor/integrated circuit DUTs from a planar semiconductor foundry plate of an array of created semiconductor/integrated circuit devices for electrical appliances.

8. The method of claim 6 and further including the step of:
l) cutting upper, inwardly inclined shoulders in the set/cured micro-molding composition tapering down from a top face of the DUT positioning frame to the created well with sidewalls opening out the bottom face of the DUT positioning frame.

9. The elements of a re-configurable test socket systems of claim 2, or 4, or 5 wherein the guide-pins have at least one annular 'V'-groove proximate its respective extending distal tips and wherein the releasable locking means firmly securing the clamping frame structure to the test printed circuit board (PCB) with its bottom face oriented parallel to the top and bottom faces of the DUT positioning frame comprises in combination therewith:
A. at least one spring-wire embedded and anchored within the clamping frame structure orthogonally intersecting each guide-pin hole positioned for snapping into the annular groove of, and releasably locking onto a guide-pin received in the guide-pin hole.

10. The elements of a re-configurable test socket systems of claim 9 wherein each single spring-wire the intersects the guide-pin hole offset from its longitudinal axis by a predetermined amount and is radially sized ($R_W$) for snapping into the annular 'V'-groove proximate the distal tip of the guide-pin.

11. The elements of a re-configurable test socket systems of claim 10 wherein each single spring-wire is coaxially secured within in a longitudinal anchor hole having a radius ($R_W$) drilled into the body of the clamping frame orthogonally through each particular guide-pin hole offset from its longitudinal axis by an offset dimension ($D_O$), where $D_O$ is less than the sum of the radius of the spring-wire, plus one half a diameter ($R_{GR}$) across the guide-pin within the "V" groove, i.e., ($D_O < (R_W + R_{GR})$.

12. The elements of a re-configurable test socket systems of claim 10 wherein a spaced parallel pair of spring-wires are embedded and anchored within the clamping frame structure orthogonally intersecting each guide-pin hole, diametrically sized ($D_W$), positioned, and offset for snapping into the annular 'V'-groove proximate the distal tip of the received guide-pin and releasably locking onto opposite sides of the guide-pin.

13. The elements of a re-configurable test socket systems of claim 12 wherein the spacing ($D_S$) between each a pair of spaced parallel spring-wires is less than the diameter ($D_W$) of the spring-wires and a diameter ($D_G$) of the guide-pin within the "V" groove, i.e., $D_S < (D_W + D_G)$, and are secured within in a longitudinal anchor hole drilled into the body of the clamping frame diametrically intersecting through each particular guide-pin hole.

14. The elements of a re-configurable test socket systems of claim 13 wherein the a spaced, parallel pair of spring-wires are held apart by a shorter spacer wire solidly encased within an inner oval-shaped shell that, in turn, is solidly encased within an outer circular shell where the spring-wires extending from each end of the assembly are parallel with a spacing set by the diameter, ($D_{SW}$), of the spacer wire.

15. The elements of a re-configurable test socket systems of claim 14 wherein the diameter ($D_{SW}$) of spacer wire is chosen for setting a desired offset of the respective spring-wires.

16. The elements of a re-configurable test socket systems of claim 2, or 4, or 5 wherein the throat housing of the clamping frame structure is cylindrical with a top entrance and a bottom exit having an inward extending annular shoulder stop at the exit co-planar with the flat bottom face of the clamping frame structure, and the means mounted within the throat housing of the clamping frame structure for applying a force ($F_{pa}$) for uniformly compressing the Z-axis anisotropic conductive elastomeric sheet between the test printed circuit board (PCB) and the DUT further comprises, in combination therewith:
   A. a pressure applicator coaxially received and translatable in the clamping frame structure throat housing having annular shoulder sized for seating upon the inward annular shoulder stop at the exit of the throat housing and presenting a coaxial nose with a planar tip surface for extending out from the bottom face of the clamping frame structure and seating onto an underlying surface;
   B. a compression spring coaxially received in the throat housing of the clamping frame structure adjustable compressed (tensioned) within the throat housing by a compression screw screwing coaxially into and out of the throat housing entrance for providing an adjustable coaxially distributed static force ($F_{PA}$) within the throat housing;
   C. a disk-shaped force-concentrator coaxially received and translatable within the throat housing between the compression spring and the pressure applicator presenting a coaxial hemispherical bead on a planar bottom surface for converting the distributed coaxial force of the compressed spring within the throat housing to a coaxial point force urging the pressure applicator toward the inward annular shoulder stop at the bottom exit of the throat housing when the clamping frame structure is locked onto the guide-pins solidly anchored to the test printed circuit board PCB for transferring a uniform field of pressure to the underlying planar surface and compressing the Z-axis conductive elastomer and establishing a plurality of electrical conduction through-paths between the respective micro arrays of electrically contactors of the DUT and contactor traces of the test printed circuit board (PCB).

17. The elements of a re-configurable test socket systems of claim 16 wherein the planar tip surface a coaxial nose of the pressure applicator extending out from the bottom face of the clamping frame structure is sized for, and seats onto a top planar surface of a DUT.

18. The elements of a re-configurable test socket systems of claim 16 wherein the planar tip surface of the coaxial nose of the pressure applicator extending out from the bottom face of the clamping frame structure coaxially seats on a planar surface area of the test printed circuit board (PCB) registering with the planar presenting surface with the particular planar microarray of conductive contactor traces sized for applying a uniform pressure for compressing the Z-axis anisotropic conductive elastomeric sheet placed between the microarray of connector traces on the surface of the test printed circuit board (PCB) and the microarray of contactors presented by the DUT to establish a plurality of electrical conduction through-paths between the respective micro arrays of electrically contactors of the DUT and contactor traces of the test printed circuit board (PCB).

19. A technique for optical aligning a planar, microarray of contactors traces presented on a planar presenting face of a planar test printed circuit board (PCB) and a particular central well of a positioning cavity of a DUT positioning frame, comprising the steps:
   a) inverting and securing a particular clamping frame structure having a throat housing with a flat bottom face and a macroscopic array of at least three parallel guide-pin holes orthogonally penetrating into the bottom face of the clamping frame structure for providing a stationary planar X-Y support platform;
   b) inserting a guide-pins coaxially each having a radius $R_P$ and having at least one annular 'V'-groove proximate its respective extending distal tips respectively for snugly into each guide-pin hole penetrating into the bottom face of the clamping frame structure;
   c) releasably locking the clamping frame structure onto the tips of each guide-pin inserted into each guide-pin hole of the macroscopic array for aligning the annular 'V'-groove proximate the extending distal tip of each pin in a reference plane elevated above and parallel to the X-Y support platform;
   d) drilling a corresponding macroscopic array of at least three guide-pin anchoring-holes orthogonally through a planar test printed circuit board (PCB) each having a radius $R_{PCBH}$ surrounding a planar microscopic array of contactors traces on a presenting face a test printed circuit board (PCB) where the radius $R_{PCBH}$ of each guide-pin anchoring hole in the macroscopic array is much greater than the radius $R_P$ of the corresponding guide-pin, i.e., $R_{PCBH} > R_P$;
   e) seating the planar test printed circuit board (PCB) on the X-Y support platform with the presenting face facing out from the platform loosely positioned and oriented in an X-Y plane on the X-Y platform by the macroscopic array of extending guide-pins received through the corresponding array of guide-pin anchoring-holes;
   f) making an exact, transparent replica of a particular semiconductor/integrated circuit DUT containing a geometric pattern of images of the microarray of contactors presented by the particular DUT;
   g) creating a bottom opening well with an open top, positioning cavity structure within a DUT positioning frame having a perimeter frame with flat top and bottom faces macroscopically surrounding the positioning cavity for snugly receiving and positioning the particular semiconductor/integrated circuit DUT;
   h) drilling a corresponding macroscopic array of at least three guide-pin holes orthogonally communicating through the perimeter frame of the DUT positioning frame each having a radius $R_{DPFH}$ sized for snugly receiving a shank of a corresponding guide-pin in the macroscopic array of guide-pins extending out from the X-Y support platform, i.e., $(R_{DPFH}) \geq R_p$);
   i) firmly seating the DUT positioning frame located and precisely oriented macroscopically by shanks of the macroscopic array of extending guide-pins received through the corresponding array of guide-pin holes through the perimeter frame, with the bottom of face the perimeter frame resting on the planar presenting face of the test printed circuit board (PCB);

j) temporarily fastening the shanks of the macroscopic array of guide-pins to the DUT positioning frame at the particular elevation parallel to the reference plane of the annular 'V'-grooves proximate the extending distal tips of the guide-pins determined by the planar test printed circuit board (PCB) firmly sandwiched between the X-Y support platform and the DUT positioning frame;

k) placing the transparent replica of the particular DUT into the open bottom well of the positioning cavity structure of the DUT positioning frame created for snugly receiving the particular DUT;

l) adjusting and orienting the test printed circuit board (PCB) in and X-Y plane by moving it in the X-Y plane of the X-Y support platform into a position of optimal microscopic optical registry between a geometric pattern of the planar microscopic array of contactors traces on presenting face the test printed circuit board the geometric pattern of images of the microarray of contactors presented in the transparent replica of the particular semiconductor/integrated circuit DUT;

m) providing an adjustable clamping force $F_C$ via means mounted within the throat housing of the clamping frame structure for tightly holding the sandwiched test printed circuit board (PCB) against the DUT at the position and orientation of optimal microscopic optical registry with the respective geometric patterns of the planar microscopic array of contactors traces on a presenting face a test printed circuit board (PCB) and the images of the microarray of the contactors in transparent replica of the particular DUT n) temporarily fastening the test printed circuit board (PCB) to the DUT positioning frame held together at the position and orientation of optimal microscopic optical registry;

o) releasing the locking means securing the clamping frame structure onto the tips of each guide-pin penetrating into its macroscopic array of guide-pin holes;

p) detaching the test printed circuit board (PCB) temporarily fastened to the DUT positioning frame and guide pins temporarily fastened to the DUT positioning frame from the inverted clamping frame structure providing the stationary planar X-Y support platform;

q) permanently anchoring the test printed circuit board (PCB) temporarily fastened to the DUT positioning frame to the respective shanks of the guide pins temporarily fastened to the DUT positioning frame extending out the guide-pin anchor-holes of the test printed circuit board (PCB).

20. The technique for optical aligning a planar, microarray of contactors traces presented on a planar presenting face of a planar test printed circuit board (PCB) and a particular central well of a positioning cavity of a DUT positioning frame of claim 19 further including the steps of:

r) removing the exact, transparent replica of the particular semiconductor/integrated circuit DUT containing a geometric pattern of images of the microarray of contactors presented by the particular DUT from the bottom opening well with an open top, positioning cavity structure within a DUT positioning frame; and s) placing the particular semiconductor/integrated circuit DUT into the open bottom well of the positioning cavity structure of the DUT positioning frame created for snugly receiving the particular DUT with the microarray of contactors facing out the bottom opening well of the positioning cavity structure of the DUT positioning frame.

21. The technique for optical aligning a planar, microarray of contactors traces presented on a planar presenting face of a planar test printed circuit board (PCB) and a particular central well of a positioning cavity of a DUT positioning frame of claim 20 further including the steps of:

t) seating the flat bottom face the particular clamping frame structure onto the top face of the DUT positioning frame oriented and positioned by the guide-pins extending out from the top face of the DUT positioning frame received in the guide-pin holes penetrating into the bottom face of the clamping frame structure;

u) releasably locking the clamping frame structure into the annular 'V'-grooves aligned in the reference plane proximate the tips of the guide-pins extending from the top face of the DUT positioning frame previously elevated above and parallel to the X-Y support platform; and v) providing an adjustable clamping force $F_T$ via the means mounted within the throat housing of the clamping frame structure for urging the microarray of contactors presented by the particular DUT into electrical connection with a plurality of the microarray of contactors traces on the presenting face of the printed circuit board (PCB).

22. The technique for optical aligning a planar, microarray of contactors traces presented on a planar presenting face of a planar test printed circuit board (PCB) and a particular central well of a positioning cavity of a DUT positioning frame of claim 21 further including the steps of:

w) placing a Z-axis anisotropic conductive elastomeric sheet between the microarray of connector traces on the presenting planar face of the test printed circuit board (PCB) and the microarray of contactors presented by the particular DUT to establish electrical connections between the respective microarrays of test contactor traces on the presenting planar surface of the test printed circuit board (PCB) and contactors of the particular DUT responsive to the adjustable clamping force $F_T$.

23. The technique for optical aligning a planar, microarray of contactors traces presented on a planar presenting face of a planar test printed circuit board (PCB) and a particular central well of a positioning cavity of a DUT positioning frame of claim 20 further including the steps of:

x) unfastening the DUT positioning frame temporarily fastened to the planar test printed circuit board (PCB);

y) removing the DUT positioning frame off the planar presenting face of the planar presenting face of the test printed circuit board (PCB);

z) placing a Z-axis anisotropic conductive elastomeric sheet over the microarray of connector traces on the presenting planar face of the test printed circuit board (PCB);

aa) re-seating the DUT positioning frame located and precisely oriented macroscopically by shanks of the macroscopic array of extending guide-pins received through the corresponding array of guide-pin holes through the perimeter frame, with the microarray of contactors of the particular semiconductor/integrated circuit DUT facing out the bottom opening well resting on the Z-axis anisotropic conductive elastomeric sheet bb) seating the flat bottom face the particular clamping frame structure onto the top face of the DUT positioning frame oriented and positioned by the guide-pins extending out from the top face of the DUT positioning frame received in the guide-pin holes penetrating into its bottom face;

cc) releasably locking the clamping frame structure into the annular 'V'-grooves aligned in the reference plane proximate the tips of the guide-pins extending from the top face of the DUT positioning frame previously elevated above and parallel to the X-Y support platform; and dd) providing an adjustable clamping force $F_T$ via the means mounted within the throat housing of the clamping frame structure for compressing the Z-axis anisotropic conductive elastomeric sheet to establish electrical connection between a plurality of the microarray of contactors presented by the particular DUT and a plurality of the microarray of contactors traces on the presenting face of the printed circuit board (PCB).

* * * * *